(12) United States Patent
Cazaux (10) Patent No.: US 6,984,817 B2
(45) Date of Patent: Jan. 10, 2006

(54) CMOS-TYPE PHOTODETECTOR FOR IMPROVED CHARGE TRANSFER FROM THE PHOTODETECTOR TO A MOS TRANSISTOR

(75) Inventor: Yvon Cazaux, Grenoble (FR)

(73) Assignee: STMicroelectronic S.A., Montrouge (FR)

( * ) Notice: Subject to any disclaimer, the term of this patent is extended or adjusted under 35 U.S.C. 154(b) by 102 days.

(21) Appl. No.: 10/142,259

(22) Filed: May 9, 2002

(65) Prior Publication Data

US 2002/0166951 A1 Nov. 14, 2002

(30) Foreign Application Priority Data

May 9, 2001 (FR) ............................................. 01 06132

(51) Int. Cl.
*H01L 31/00* (2006.01)

(52) U.S. Cl. ..................................... 250/214.1; 257/292
(58) Field of Classification Search .............. 250/214.1, 250/208.1; 257/288–292, 458, 459, 465, 257/466; 438/57

See application file for complete search history.

(56) References Cited

U.S. PATENT DOCUMENTS

| | | | |
|---|---|---|---|
| 4,242,694 A | 12/1980 | Koike et al. | |
| 4,407,010 A | 9/1983 | Baji et al. | |
| 4,630,091 A | 12/1986 | Kuroda et al. | |
| 4,996,578 A | 2/1991 | Motojima et al. | |

(Continued)

FOREIGN PATENT DOCUMENTS

| | | | |
|---|---|---|---|
| EP | 0 152 353 A1 | * | 8/1985 |
| EP | 0 223 136 A2 | * | 5/1987 |
| EP | 1 207 686 A1 | * | 5/2002 |
| GB | 2 276 512 A | * | 9/1994 |

(Continued)

OTHER PUBLICATIONS

French Search Report from French Patent Application 01/06132, filed May 9, 2001.
Patent Abstracts of Japan, vol. 009, No. 061 (E–303), Mar. 19, 1985 & JP 59 198756 A (Hitachi Seisakusho KK), Nov. 10, 1984.
Patent Abstracts of Japan, vol. 2000, No. 11, Jan. 2, 2001 & JP 2000 236081 A (Nikon Corp.) Aug. 29, 2000.
Patent Abstracts of Japan, vol. 1998, No. 03, Feb. 27, 1998 & JP 09 289301 A (Nikon Corp.) Nov. 4, 1997.
Patent Abstracts of Japan, vol. 009, No. 262 (P–398), Oct. 19, 1985 & JP–A–60 111225 (Matsushita Denki Sangyo KK).*
Patent Abstracts of Japan, vol. 1998, No. 09, Jul. 31, 1998 & JP 10 098175 A (Toshiba Corp.).*
Furumiya M. et al., "High Sensitivity and No–Cross–Talk Pixel Technology For Embedded CMOS Image Sensor" International Electron Devices Meeting 2000. IEDM. Technical Digest, San Francisco, CA, Dec. 10–13, 2000, New York, NY: IEEE, US, Dec. 10, 2000, pp. 701–704.*

*Primary Examiner*—Thanh X. Luu
(74) *Attorney, Agent, or Firm*—Lisa K. Jorgenson; James H. Morris; Wolf, Greenfield & Sacks, P.C.

(57) ABSTRACT

A photodetector formed in an active area of a semiconductor substrate of a first conductivity type, including a MOS transistor and a photodiode formed of the junction between the substrate and a region of a second conductivity type also forming the source of the MOS transistor, a heavily-doped layer of the first conductivity type covering the source region and a portion of the substrate, said portion of the substrate being delimited by an opening of the source region extending in a centered manner from the side of the source region opposite to the channel region of the transistor, towards this channel region.

29 Claims, 4 Drawing Sheets

U.S. PATENT DOCUMENTS

| | | | |
|---|---|---|---|
| 5,084,747 A | 1/1992 | Miyawaki | |
| 5,191,399 A | 3/1993 | Maegawa et al. | |
| 5,237,185 A | 8/1993 | Udagawa et al. | |
| 5,268,309 A | 12/1993 | Mizutani et al. | |
| 5,306,931 A | 4/1994 | Stevens | |
| 5,330,933 A | 7/1994 | Chan et al. | |
| 5,345,266 A | 9/1994 | Denyer | |
| 5,502,488 A | 3/1996 | Nagasaki et al. | |
| 5,591,997 A | 1/1997 | Guidash et al. | |
| 5,614,744 A | 3/1997 | Merrill | |
| 5,621,230 A | 4/1997 | Guidash et al. | |
| 5,747,835 A | 5/1998 | Pezzani | |
| 5,831,326 A | 11/1998 | Chan et al. | |
| 5,859,462 A | 1/1999 | Tredwell et al. | |
| 5,881,184 A | 3/1999 | Guidash | |
| 5,903,021 A | 5/1999 | Lee et al. | |
| 5,926,214 A | 7/1999 | Denyer et al. | |
| 5,945,722 A | 8/1999 | Tsuei et al. | |
| 5,949,061 A | 9/1999 | Guidash et al. | |
| 5,978,025 A | 11/1999 | Tomasini et al. | |
| 5,981,932 A | 11/1999 | Guerrieri et al. | |
| 5,982,011 A | 11/1999 | Kalnitsky et al. | |
| 5,986,297 A | 11/1999 | Guidash et al. | |
| 6,019,848 A | 2/2000 | Frankel et al. | |
| 6,049,118 A | 4/2000 | Nagano | |
| 6,051,447 A | 4/2000 | Lee et al. | |
| 6,067,113 A | 5/2000 | Hurwitz et al. | |
| 6,069,377 A | 5/2000 | Prentice et al. | |
| 6,087,703 A | 7/2000 | Ohta et al. | |
| 6,100,551 A | 8/2000 | Lee et al. | |
| 6,100,556 A | 8/2000 | Drowley et al. | |
| 6,107,655 A | 8/2000 | Guidash | |
| 6,127,697 A | 10/2000 | Guidash | |
| 6,133,954 A * | 10/2000 | Jie et al. | |
| 6,150,683 A * | 11/2000 | Merrill et al. | |
| 6,160,281 A * | 12/2000 | Guidash | |
| 6,160,282 A * | 12/2000 | Merrill | |
| 6,188,056 B1 * | 2/2001 | Kalnitsky et al. | |
| 6,218,210 B1 * | 4/2001 | Park | 438/57 |
| 6,218,656 B1 * | 4/2001 | Guidash | |
| 6,259,124 B1 * | 7/2001 | Guidash | |
| 6,352,876 B1 * | 3/2002 | Bordogna et al. | |
| 6,380,572 B1 * | 4/2002 | Pain et al. | |
| 6,504,195 B2 * | 1/2003 | Guidash | 257/292 |
| 2001/0045580 A1 * | 11/2001 | Descure | |
| 2002/0011638 A1 * | 1/2002 | Bordogna et al. | |
| 2002/0019070 A1 * | 2/2002 | Laurin et al. | |
| 2002/0030753 A1 * | 3/2002 | Kramer et al. | |
| 2002/0051067 A1 * | 5/2002 | Henderson et al. | |

FOREIGN PATENT DOCUMENTS

| | | | |
|---|---|---|---|
| WO | WO 92/15036 A1 * | 9/1992 | |
| WO | WO 92/16999 A1 * | 10/1992 | |
| WO | WO 93/04556 A1 * | 3/1993 | |
| WO | WO 97/20434 A1 * | 6/1997 | |
| WO | WO 97/35438 A1 * | 9/1997 | |
| WO | WO 98/49729 A1 * | 11/1998 | |
| WO | WO 99/57887 A1 * | 11/1999 | |
| WO | WO 00 52765 A1 | 9/2000 | |

* cited by examiner

CMOS-TYPE PHOTODETECTOR FOR IMPROVED CHARGE TRANSFER FROM THE PHOTODETECTOR TO A MOS TRANSISTOR

BACKGROUND OF THE INVENTION

1. Field of the Invention

The present invention relates to the monolithic forming of image sensors intended to be used in shooting devices such as, for example, cameras, camcorders, digital microscopes, or digital photographic cameras. More specifically, the present invention relates to image sensors formed in CMOS technology.

2. Discussion of the Related Art

An image sensor formed in CMOS technology generally includes a matrix of photodetectors arranged at the intersection of lines and columns.

Figure 1:
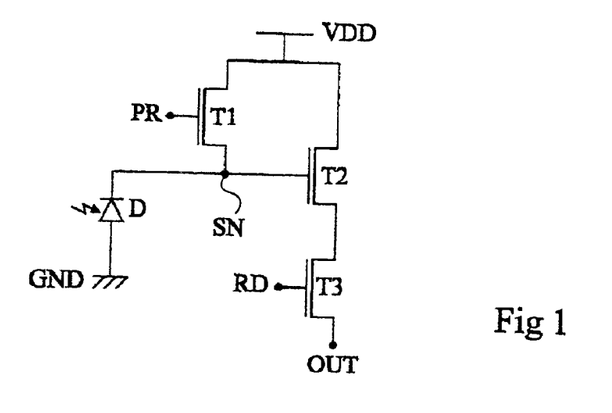
FIG. 1, previously described, schematically shows a first CMOS-type photodetector.

FIG. 1 schematically shows a first example of a CMOS-type photodetector. A photodiode D has its anode connected to a reference supply rail or circuit ground GND. The cathode of photodiode D is connected to a detection node SN. Two N-channel MOS transistors T1 and T2 have their drain connected to a high supply rail VDD. The source of transistor T1 and the gate of transistor T2 are connected to detection node SN. The gate of transistor T1 receives a precharge control signal PR. An N-channel MOS transistor T3 has its drain connected to the source of transistor T2. The source of transistor T3 is connected by a read terminal OUT to a read block not shown. The gate of transistor T3 receives a read control signal RD.

Figure 2:
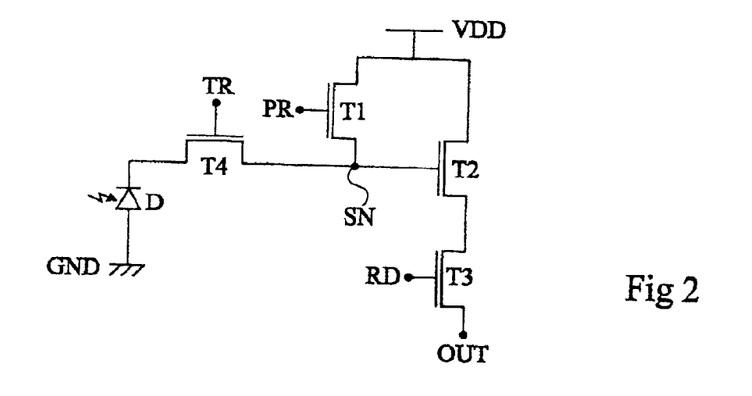
FIG. 2, previously described, schematically shows a second CMOS-type photodetector.

FIG. 2 schematically shows a second example of a photodetector of CMOS type. In addition to the elements of the photodetector of FIG. 1, the photodetector of FIG. 2 includes an N-channel MOS transistor T4. The cathode of photodiode D is connected to the source of transistor T4. The drain of transistor T4 is connected to detection node SN. The gate of transistor T4 receives a charge transfer control signal TR. The operation and the respective advantages of the photodetectors of FIGS. 1 and 2, are known.

Figure 3:
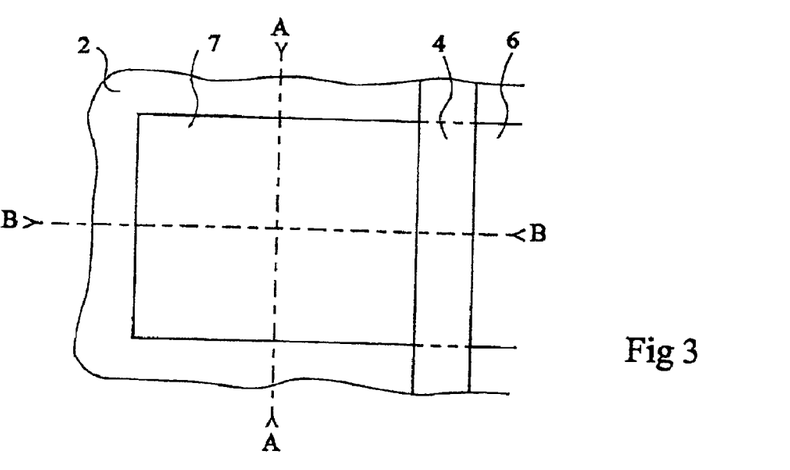
FIG. 3 previously described, schematically shows a top view of photodiode D and of transistor T4 of FIG. 2.

FIG. 3 schematically shows a top view of the regions which form photodiode D and transistor T4 of FIG. 2. Photodiode D and transistor T4 are formed in a same active area of a lightly-doped P-type semiconductor substrate. The active area is delimited by an insulating area 2 which can be formed, for example, by means of a silicon oxide ($SiO_2$). An insulated gate structure 4 of predetermined width is formed across the active area. On either side of gate 4, in the substrate surface, are N-type source and drain regions of transistor T4. The source region is formed in a much larger surface than the drain region. This N-type source region also forms with the underlying P-type substrate the photodiode junction. The source region is covered with a heavily-doped P-type layer 7 in contact with the substrate. Photodiode D then is of the so-called filly depleted type. On the top view of FIG. 3, drain region 6 can be seen on the right-hand side of gate 4 and heavily-doped P-type layer 7 can be seen on the left-hand side of gate 4. The source region, designated hereafter by reference 5, is not visible in FIG. 3.

Figure 4:
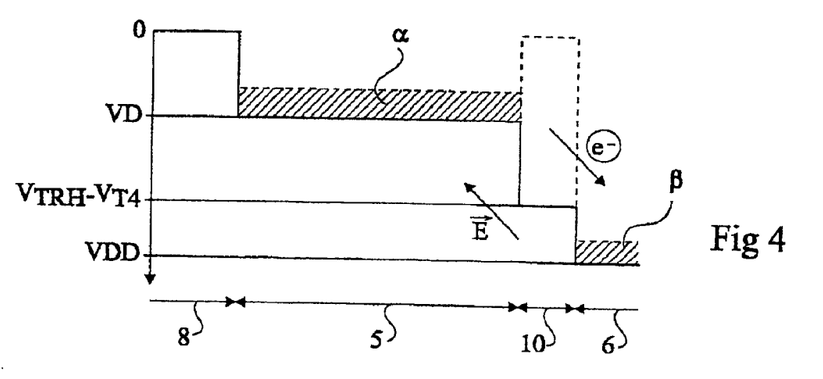
FIG. 4, previously described, illustrates the voltage levels of different regions of FIG. 3.

FIG. 4 illustrates the voltage levels along axis B—B of the insulating area brought to substrate voltage 8, of source region 5 corresponding to the photodiode, of a channel area 10 located under gate 4, and of drain region 6, in different operating steps.

In an initialization step, transistor T1 is turned on and drain 6 of transistor T4 is set to voltage VDD. The gate of transistor T4 is at a high voltage $V_{TRH}$ and transistor T4 is on. Channel area 10 is at a voltage $V_{TRH}$-$V_{T4}$, where $V_{T4}$ is the threshold voltage of transistor T4. The voltage across photodiode D reaches a so-called depletion quiescent level VD set by the characteristics of the photodiode. Region 5, forming the cathode of diode D, is at voltage VD.

In a light-measurement or integration step, transistors T1 and T4 are off and drain 6 of transistor T4 and the photodiode are isolated. Stray capacitances (not shown) connected to drain 6 maintain the voltage of drain 6 at VDD. Region 5 of photodiode D, which forms a potential well, fills up (hatched area α) according to the photodiode lighting. This period corresponds to the signal integration in the photodetector.

In a step of reading of the light measured by the photodiode, transistor T4 is turned on (transistor T1 being maintained off). Channel area 10 is at voltage $V_{TRH}$-$V_{T4}$. The charges accumulated in region 5 then are transferred to region 6, the voltage of which varies (hatched area β). The voltage variation of region 6 causes a modification of the conduction of transistor T2, which corresponds to the amount of transferred charges.

The use of a photodiode D of fully depleted type enables, as known, eliminating the initialization or precharge noise introduced by MOS transistor T1. For the photodiode to be of fully depleted type, the doping profiles are chosen so that region 5, pinched between layer 7 and substrate 8, is depleted. In the absence of any radiation, region 5, forming the photodiode cathode, is maintained at a depletion state voltage VD. Voltage VD depends on the number of charges pushed out of N-type region 5 by the depletion of region 5. Voltage VD can be adjusted by the doping profiles of layer 7, of region 5, and of substrate 8. Voltage VD is chosen, as illustrated in FIG. 4, at a value smaller than voltage $V_{TRH}$-$V_{T4}$ of channel 10 of transistor T4 when transistor T4 is turned on, to enable full transfer of the charges from region 5 to drain 6.

For photodiode D to properly operate, layer 7 and substrate 8 must be maintained at the same voltage, that is, there must exist a good contact between these regions. In the state of the art, layer 7 is for example in lateral contact with substrate 8, but the quality of such a lateral contact is linked to a minute adjustment of the manufacturing process, especially upon creation of region 5 and of layer 7. A modification of the manufacturing process causing a reduction in the surface area of layer 7 with respect to the surface of region 5 may damage, or even cause the disappearing of the contact between substrate 8 and layer 7, and cause a malfunction of photodiode D.

SUMMARY OF THE INVENTION

An object of the present invention is to provide a CMOS-type photodetector which is easy to form and which is robust with respect to possible manufacturing process modifications.

To achieve this and other objects, the present invention provides a photodetector formed in an active area of a semiconductor substrate of a first conductivity type, including a MOS transistor and a photodiode formed of the junction between the substrate and a region of a second conductivity type also forming the source of the MOS transistor, a heavily-doped layer of the first conductivity type covering the source region and a portion of the substrate, said portion of the substrate being delimited by an opening of the source region extending in a centered manner from the side of the source region opposite to the channel region of the transistor, towards this channel region.

According to an embodiment of the present invention, the opening of the source region is rectangular.

According to an embodiment of the present invention, the opening of the source region has a width increasing from the inside towards the edge of the source region.

According to an embodiment of the present invention, the first conductivity type is type P and the second conductivity type is type N, and the substrate and said layer are maintaine at a preference of the circuit.

Figure 6A:
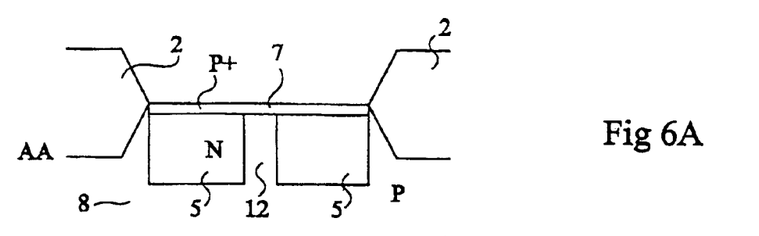
FIGS. 6A, 6B, 6C, and 6D schematically show cross-section views of the photodiode and of the MOS transistor of FIG. 5.
Figure 6B:
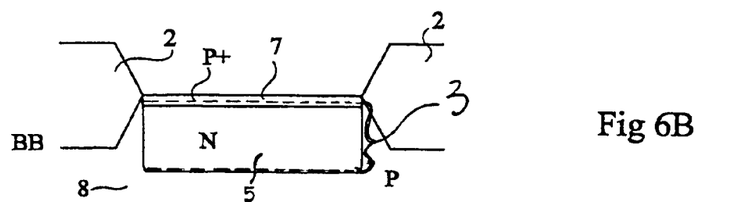

According to an embodiment of the present invention, the thickness of the source region and the respective dopings of the source region and of said layer are such that the space charge area between the source region and said layer takes up the entire thickness of the source region as shown at 3 in FIG. 6B.

The present invention also aims at a photodetector including a photodiode having its anode connected to a reference voltage, a transfer MOS transistor having its source connected to the cathode of the photodiode, a precharge MOS transistor having its source connected to the drain of the transfer MOS transistor and having its drain maintained at a supply voltage, a control MOS transistor having its drain maintained at the supply voltage and having its gate connected to the drain of the transfer MOS transistor, and a read MOS transistor having its drain connected to the source of the control MOS transistor, the photodiode and the transfer transistor respectively being a photodiode and a MOS transistor such as previously described.

The present invention also aims at a photodetector including a photodiode having its anode connected to a reference voltage, a precharge MOS transistor having its source connected to the cathode of the photodiode and its drain maintained at a supply voltage, and a read means including a control MOS transistor having its gate connected to the source of the precharge MOS transistor and a read MOS transistor connected in series with the control MOS transistor between the supply voltage and a read terminal, wherein the photodiode and the precharge transistor respectively are a photodiode and a MOS transistor such as previously described.

The foregoing objects, features and advantages of the present invention will be discussed in detail in the following non-limiting description of specific embodiments in connection with the accompanying drawings.

DETAILED DESCRIPTION

The same elements have been designated with the same references in the different drawings. Only those elements which are necessary to the understanding of the present invention have been shown in the different drawings. Further, for readability reasons, the drawings showing the different semiconductor regions are not drawn to scale.

Figure 5:
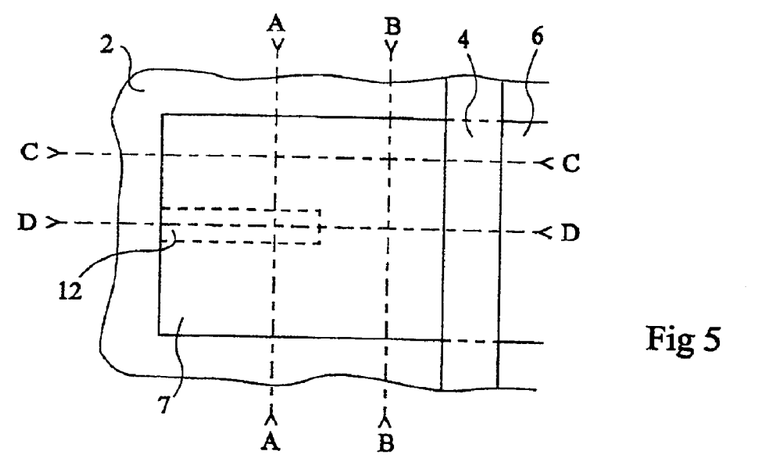
FIG. 5 schematically shows a top view of a photodiode and of a MOS transistor of a photodetector according to the present invention.

FIG. 5 schematically shows a top view of the regions forming photodiode D and transistor T4 of a photodetector according to the present invention, of the same type as the photodetector of FIG. 2. Photodiode D and transistor T4 are formed in a same active area of a lightly-doped semiconductor substrate of a first conductivity type, for example, type P. This substrate for example corresponds to an epitaxial layer on a silicon wafer. The active area, substantially rectangular, is delimited by a field insulation area 2, for example, silicon oxide (SiO2). An insulated gate structure 4 of predetermined width is formed across the active area. On either side of gate 4, in the substrate surface, are N-type source and drain regions 5 and 6 of the MOS transistor. Source region 5 is formed on a much larger surface area than drain region 6 and forms with the underlying substrate the junction of photodiode D. A shallow P-type layer 7 more heavily doped (P+) than the N region, takes up the entire surface area of the active area located on the left-hand side of gate 4 in FIG. 5. According to the present invention, region 5 has an opening 12 to create between substrate 8 and layer 7 a contact area having the shape of a centered narrow strip, perpendicular to gate 4. Opening 12 extends from the edge of field insulation area 2 opposite to the gate without reaching gate 4. The contact introduced between substrate 8 and layer 7 through opening 12 is not likely to disappear due to a slight manufacturing process variation. The present invention thus enables providing a robust contact between substrate 8 and layer 7.

FIG. 6A schematically shows a cross-section view along line A—A of FIG. 5, parallel to the gate of transistor T4 and sufficiently far from gate 4 to cut opening 12 of region 5. The active area of substrate 8, delimited to the left and to the right of the drawing by field insulation area 2, is covered with region 7. Region 5 extends under layer 7, on either side of opening 12.

FIG. 6B schematically shows a cross-section view along line B—B of FIG. 5, parallel to the gate of transistor T4 and sufficiently close to gate 4 to cut region 5 outside opening 12. The active area of the substrate 8, delimited to the left and to the right of the drawing by field insulation area 2, is covered with region 7. Region 5 extends under layer 7.

Figure 6C:
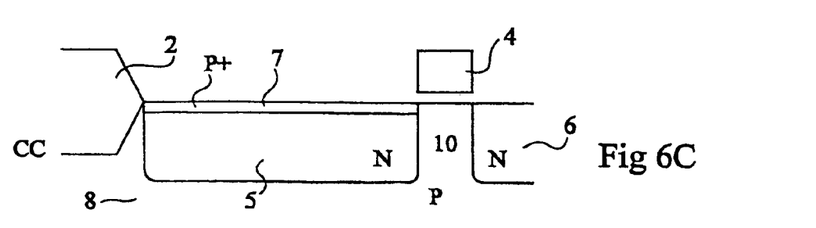

FIG. 6C schematically shows a cross-section view along line C—C of FIG. 5, perpendicular to gate 4 of transistor T4 and not centered, to cut region 5 outside of opening 12. Layer 7 extends between field insulation area 2, on the left-hand side of the drawing, and channel region 10 located under gate 4 of transistor T. Region 5 extends under layer 7. Region 6, forming the transistor drain, extends towards the right of the drawing from channel area 10.

Figure 6D:
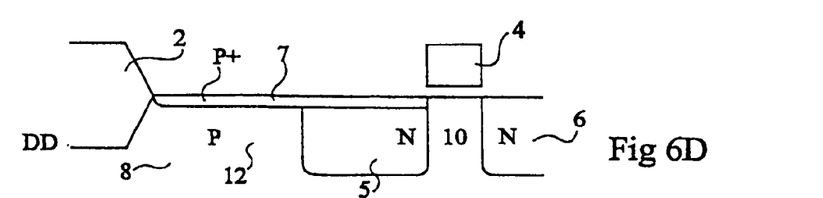
Figure 7:
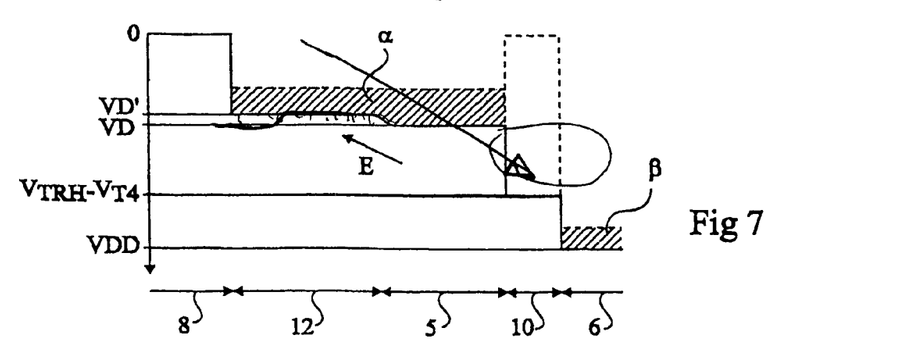
FIG. 7 illustrates the voltage levels of different regions of the photodiode and of the transistor of FIG. 5.

FIG. 6D schematically shows a cross-section view along line D—D of FIG. 7, perpendicularly to gate 4 of transistor T4, centered to cut region 5 at the level of opening 12. Opening 12 extends from field insulation area 2, on the left-hand side of the drawing, without reaching channel region 10. Region 5 extends between the bottom of opening 12 and area 10. Region 6, forming the drain of the transistor, extends towards the right of the drawing from channel area 10.

A photon which reaches a photodiode releases an electron-hole pair in area 5 or in substrate 8. Region 5 forming a potential well, the electrons thus released accumulate in region 5. The amount of electrons accumulated in a given period is proportional to the amount of light received during this period. When a photon reaches a photodiode according to the present invention at the level of opening 12, the electron formed is easily captured by region 5 located on one side or the other of opening 12. The centered arrangement of opening 12 thus enables avoiding that an electron released at the level of opening 12 be captured by a device close to the photodiode. The electrons generated at the level of the contact area between the substrate and layer 7 of a photodiode thus have little chance of being captured by an adjacent photodiode, conversely to the case where the contact area is a region located at the periphery of source 5. This enables precise measurement of the light received by each photodiode by avoiding a diffusion phenomenon between adjacent points and is an additional advantage of the present invention.

The depletion state voltage of the photodiode depends, as seen previously, on the total number of charges pushed out of N-type region 5 due to the presence of layer 7. The number of charges pushed out of region 5 of a photodiode D according to the present invention is smaller at the level of opening 12 than at the level of the rest of the diode. As a result, at the level of opening 12, photodiode D exhibits a depletion state voltage VD' smaller than its depletion state voltage VD in the rest of the diode.

FIG. 7 illustrates the voltage levels of the different regions forming photodiode D and transistor T4 shown in FIG. 5 in different operating steps. The initialization, measurement, and read steps are the same as those described in relation with FIG. 4.

In the read step, the difference of the values of voltages VD and VD' creates in region 5 an electric field E adapted to easing the charge transfer from region 5 to region 6. This especially enables improving the operating speed and the precision of a photodetector according to the present invention, and is an additional advantage of the present invention.

Figure 8:
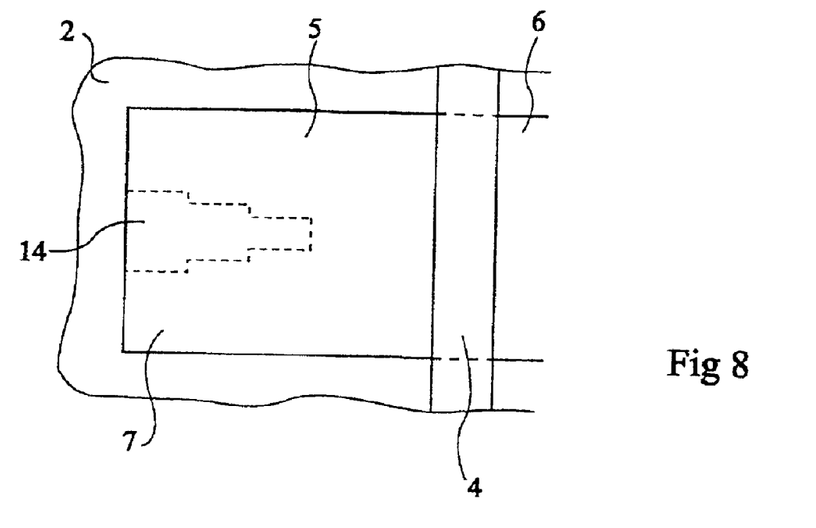
FIG. 8 schematically shows a top view of a photodiode and of a MOS transistor of a photodetector according to an alternative of the present invention.

FIG. 8 schematically shows a top view of the regions forming the photodiode D and the transistor T4 of a photodetector according to an alternative of the present invention. According to this alternative, instead of including a strip-shaped opening 12 of constant width, region 5 includes an opening 14, the width of which increases by steps towards the edge of region 5 opposite to the channel region. This shape of opening 14 causes the existence of a gradient of the voltage in depletion state, instead of the simple variation by steps illustrated in FIG. 7. This voltage gradient creates an electric field E particularly well adapted to a fast and total charge transfer between regions 5 and 6 in a step of reading of the light measured by the photodiode.

Of course, the present invention is likely to have various alterations, modifications, and improvements which will readily occur to those skilled in the art. In particular, those skilled in the art will know how to adjust the doping levels and types to the desired performances and to the materials used according to the constraints of a specific CMOS manufacturing technology.

The present invention has been described in relation with a photodetector of the type shown in FIG. 2, but those skilled in the art can readily adapt the present invention to a photodetector of the type shown in FIG. 1, especially by substituting transistor T1 of FIG. 1 to transistor T4 of FIG. 2. Those skilled in the art will also readily adapt the present invention to other CMOS-type photodetector structures.

The present invention has been described in relation with a diode D and a transistor T4 formed in a substantially rectangular active area, but those skilled in the art can readily adapt the present invention to an active area having a different shape.

The present invention has been described in relation with a diode D and a transistor T4 formed in an active area of a semiconductor substrate, but those skilled in the art can readily adapt the present invention to a diode D and a transistor T4 formed in a P-type well of a semiconductor substrate.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A photodetector formed in an active area of a semiconductor substrate of a first conductivity type, including a MOS transistor and a photodiode, said transistor having a source region disposed on a first side of a channel region and a drain region disposed on a second side of the channel region, said photodiode being formed of the junction between the substrate and a region of a second conductivity type formed in a planar surface of the substrate and also forming the source region of the MOS transistor, a heavily-doped layer of a first conductivity type covering the source region and a portion of the substrate, wherein said source region has first and second sides, the first side of the source region being disposed between the second side of the source region and the channel region, the source region having a length extending between the first and second sides of the source region, a width in a direction orthogonal to the length and parallel to a top surface of the source region, and an opening filled by the portion of the substrate, the portion extending from a center of the second side of the source region, towards the channel region, the portion having a width, in the direction orthogonal to the length, that is narrower than the width of the source region.

2. The photodetector of claim 1, wherein said portion of the substrate is rectangular.

3. The photodetector of claim 1, wherein the width of the portion of the substrate increases from a side of the portion nearest the channel region towards the second side of the source region opposite to the channel region.

4. The photodetector of claim 1, wherein the first side and the second sides of the channel region are on opposite sides of the channel region.

5. The photodetector of claim 1, wherein the first conductivity type is type P and the second conductivity type is type N, and the substrate and said layer are maintained at a reference voltage of the photodetector.

6. The photodetector of claim 1, wherein a thickness of the source region and respective dopings of the source region and of said layer are such that a space charge area formed at a junction of the source region and said layer takes up the entire thickness of the source region.

7. A photodetector including a photodiode having an anode connected to a reference voltage, a transfer MOS transistor having a source connected to a cathode of the photodiode, a precharge MOS transistor having a source connected to a drain of the transfer MOS transistor and having a drain maintained at a supply voltage, a control MOS transistor having a drain maintained at a supply voltage and having its gate connected to the drain of the transfer MOS transistor, and a read MOS transistor having a drain connected to a source of a control MOS transistor, wherein the photodiode and the transfer transistor, respectively, are the photodiode and the MOS transistor of claim 1.

8. A photodetector including a photodiode having a anode connected to a reference voltage, a precharge MOS transistor having a source connected to the cathode of the photodiode and its drain maintained at a supply voltage, and a read means including a control MOS transistor having a gate connected to the source of the precharge MOS transistor and a read MOS transistor connected in series with the control MOS transistor between a supply voltage and a read terminal, wherein the photodiode and the precharge transistor, respectively, are the photodiode and the MOS transistor of claim 1.

9. An apparatus comprising:
a photodiode, the photodiode comprising:
a first region of a first conductivity type, the first region including a first portion and a second portion;
a layer of the first conductivity type disposed above the first region; and
a second region of a second conductivity type disposed between and in contact with the layer and the first portion of the first region, and having an opening extending from the first region to the layer, the opening being disposed so that a straight line drawn between at least two points in the second region passes through the opening,
wherein the second portion of the first region extends through the opening and is in contact with the layer.

10. The apparatus of claim 9, further comprising:
a transistor coupled to the photodiode, the transistor including the second region as a source and having a channel region spaced from the second portion.

11. The apparatus of claim 10, wherein the opening extends to a lateral boundary of the second region, and, within the opening, the second portion extends to the lateral boundary.

12. The apparatus of claim 11, wherein a width of a surface area of the second portion increases as a distance from the channel region increases.

13. The apparatus of claim 12, wherein the width of a surface area of the second portion increases in a stepwise manner as a distance from the channel region increases.

14. The apparatus of claim 10, wherein a width of a surface area of the second portion increases as a distance from the channel region increases.

15. The apparatus of claim 14, wherein the width of a surface area of the second portion increases in a stepwise manner as a distance from the channel region increases.

16. The apparatus of claim 10, wherein the photodiode further comprises an anode connected to a reference voltage, and wherein the transistor is a transfer MOS transistor, the apparatus further comprising:
a precharge MOS transistor having a source connected to a drain of the transfer MOS transistor and having a drain connected to a supply voltage;
a control MOS transistor having a drain connected to the supply voltage and having a gate connected to the drain of the transfer MOS transistor; and
a read MOS transistor having a drain connected to a source of the control MOS transistor.

17. The apparatus of claim 10, wherein the photodiode further comprises an anode connected to a reference voltage, and the transistor is a precharge MOS transistor having a drain connected to a supply voltage, the apparatus further comprising:
a control MOS transistor having a gate connected to the source of the precharge MOS transistor; and
a read MOS transistor connected in series with the control MOS transistor between a supply voltage and a read terminal.

18. The apparatus of claim 10, wherein the transistor is a MOS transistor.

19. The apparatus of claim 9, wherein the second portion is operable to maintain the first region and the layer at a same reference potential.

20. The apparatus of claim 9, wherein the layer is more heavily doped than the first region.

21. The apparatus of claim 9, wherein the second portion is shaped like a rectangular prism.

22. The apparatus of claim 9, wherein the first region is a substrate.

23. The apparatus of claim 9, wherein a junction of the first region and the second region forms a junction of the photodiode.

24. The apparatus of claim 9, wherein a depth of the second region and dopings of the second region and the layer are such that a space charge region formed by a junction of the second region and the layer extends across the entire depth of the second region.

25. The apparatus of claim 9, wherein the first conductivity type is P type and the second conductivity type is N type.

26. The apparatus of claim 9, wherein the first conductivity type is N type and the second conductivity type is P type.

27. The apparatus of claim 9, wherein the first region and the layer are connected to a reference voltage of the photodiode such that the first region and the layer are operable to be maintained at the reference voltage during operation of the photodetector.

28. An apparatus comprising: a substrate of a first conductivity type; a transistor including a source region of a second conductivity type and formed within the substrate, and a drain region of the second conductivity type, formed within the substrate, to which charge is transferred from the source region; a photodiode to accumulate the charge, including a layer of the first conductivity type that is more heavily doped than the substrate, and is disposed above and in contact with the source region; and a first region of the first conductivity type, including means for maintaining the substrate and the layer at a same voltage potential and for facilitating the transfer of charge from the source region to the drain region.

29. The apparatus of claim 28, wherein the first region is a portion of the substrate.

* * * * *

UNITED STATES PATENT AND TRADEMARK OFFICE
CERTIFICATE OF CORRECTION

PATENT NO. : 6,984,817 B2  Page 1 of 1
APPLICATION NO. : 10/142259
DATED : January 10, 2006
INVENTOR(S) : Yvon Casaux It is certified that error appears in the above-identified patent and that said Letters Patent is hereby corrected as shown below:

On the title page:
Item (73) should read:
(73) Assignee: STMicroelectronics S.A., Montrouge, (FR)

Col. 1, line 55 should read:
--then is of the so-called filly depleted type. On the top view.--

Col. 3, lines 9-10 should read:
--type is type N, and the substrate and said layer are maintained at a preference of the circuit --

Signed and Sealed this

Twelfth Day of December, 2006

JON W. DUDAS
*Director of the United States Patent and Trademark Office*